US 8,976,615 B2

(12) United States Patent
Shin et al.

(10) Patent No.: US 8,976,615 B2
(45) Date of Patent: Mar. 10, 2015

(54) SEMICONDUCTOR MEMORY DEVICE CAPABLE OF PERFORMING REFRESH OPERATION WITHOUT AUTO REFRESH COMMAND

(71) Applicant: Samsung Electronics Co., Ltd., Suwon-si, Gyeonggi-Do (KR)

(72) Inventors: Hyun-Sung Shin, Seoul (KR); Seung-Man Shin, Suwon-si (KR); In-Su Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/970,738

(22) Filed: Aug. 20, 2013

(65) Prior Publication Data

US 2014/0078846 A1 Mar. 20, 2014

(30) Foreign Application Priority Data

Sep. 17, 2012 (KR) .................... 10-2012-0102936

(51) Int. Cl.
*G11C 7/00* (2006.01)
*G11C 11/34* (2006.01)
*G11C 8/18* (2006.01)
*G11C 11/406* (2006.01)

(52) U.S. Cl.
CPC ...... *G11C 11/34* (2013.01); *G11C 8/18* (2013.01); *G11C 11/40615* (2013.01); *G11C 11/40618* (2013.01)
USPC ..... 365/222; 365/203; 365/233.1; 365/230.3; 365/233.16; 365/230.01

(58) Field of Classification Search
CPC .. G11C 29/48; G11C 2207/104; G11C 11/34; G11C 11/401; G11C 29/14; G11C 7/12; G11C 8/10; G11C 8/12; G11C 11/40618
USPC ............ 365/222, 203, 230.08, 233.1, 230.01, 365/230.03, 230.06, 233.16
See application file for complete search history.

(56) References Cited

U.S. PATENT DOCUMENTS

| 6,757,784 | B2 | 6/2004 | Lu et al. |
| 7,079,440 | B2 | 7/2006 | Remaklus, Jr. et al. |
| 7,236,416 | B2 | 6/2007 | Walker |
| 7,394,712 | B2 | 7/2008 | Do |
| 7,450,444 | B2 | 11/2008 | Demone |

(Continued)

FOREIGN PATENT DOCUMENTS

| KR | 2007-0093750 A | 9/2007 |
| KR | 10-0838375 B1 | 6/2008 |

(Continued)

*Primary Examiner* — Thong Q Le
(74) *Attorney, Agent, or Firm* — Harness, Dickey & Pierce, P.L.C.

(57) ABSTRACT

A semiconductor memory device includes an internal address generating circuit; an internal command generating circuit; and a memory cell array including one or more memory bank groups. The semiconductor memory device is configured such that when a read command or a write command is input, if a first portion of a plurality of memory banks of a first memory bank group from among one or more memory bank groups of the memory cell array performs a read operation or a write operation, a second portion of the plurality of memory banks of the first memory bank group performs a refresh operation.

19 Claims, 9 Drawing Sheets

(56) References Cited

U.S. PATENT DOCUMENTS

| | | |
|---|---|---|
| 7,492,656 B2 | 2/2009 | Kim et al. |
| 7,586,805 B2 | 9/2009 | Remaklus, Jr. et al. |
| 7,636,269 B2 | 12/2009 | Do |
| 7,751,262 B2 | 7/2010 | Demone |
| 7,916,569 B2 | 3/2011 | Kim et al. |
| 7,930,471 B2 | 4/2011 | Walker |
| 8,045,413 B2 | 10/2011 | Demone |
| 8,171,211 B2 | 5/2012 | Walker |
| 8,295,115 B2 | 10/2012 | Kim et al. |
| 2004/0208076 A1* | 10/2004 | Arimoto et al. ............... 365/222 |
| 2012/0008426 A1 | 1/2012 | Demone |

FOREIGN PATENT DOCUMENTS

| | | |
|---|---|---|
| KR | 10-0844300 B1 | 7/2008 |
| KR | 10-0869870 B1 | 11/2008 |
| KR | 10-0871080 B1 | 11/2008 |
| KR | 2009-0005382 A | 1/2009 |
| KR | 10-1049312 B1 | 7/2009 |

* cited by examiner

SEMICONDUCTOR MEMORY DEVICE CAPABLE OF PERFORMING REFRESH OPERATION WITHOUT AUTO REFRESH COMMAND

CROSS-REFERENCE TO RELATED APPLICATION

This application claims priority under 35 U.S.C. §119 to Korean Patent Application No. 10-2012-0102936 filed on Sep. 17, 2012, the disclosure of which is hereby incorporated by reference in its entirety.

BACKGROUND

1. Field

Example embodiments of the inventive concepts relate to a memory device, and particularly to a semiconductor memory device and a memory system including the same.

2. Description of Related Art

Semiconductor memory devices may be classified into volatile memory devices and nonvolatile memory devices. In a volatile memory device such as a dynamic random access memory (DRAM), it is required to perform refresh operation at a predetermined period to retain data stored in a memory cell.

SUMMARY

Example embodiments of the inventive concepts provide a semiconductor memory device capable of performing refresh without using an auto refresh command.

Example embodiments of the inventive concepts also provide a memory system including the semiconductor memory device.

Example embodiments of the inventive concepts also provide a method of controlling a semiconductor memory device capable of performing refresh without using an auto refresh command.

The technical objectives of example embodiments of the inventive concepts are not limited to the above disclosure; other objectives may become apparent to those of ordinary skill in the art based on the following descriptions.

In accordance with example embodiments of the inventive concepts, a semiconductor memory device includes an internal address generating circuit, an internal command generating circuit and a memory cell array.

The internal address generating circuit is configured to parse an external address and control timing of the external address to generate an internal address. The internal command generating circuit is configured to control timing of auto refresh based on the external address and an external command and control timing of the external command to generate an internal command. The memory cell array includes at least one memory bank group, and each of the memory bank group includes a plurality of memory banks and operates in response to the internal address and the internal command. When a read command or a write command is input, in case that a part of memory bank(s) of a first memory bank group perform(s) a read operation or a write operation, the rest of the memory bank(s) of the first memory bank group may perform in a refresh operation.

In an embodiment, the internal address may have an address structure in which a row address and a column address are integrated.

In an embodiment, the memory bank(s) that perform(s) a read operation or a write operation may automatically perform an active operation, a read/write operation and a pre-charge operation when a read command or a write command is input.

In an embodiment, the semiconductor memory device may perform the active operation and the pre-charge operation without using an active command and a pre-charge command.

In an embodiment, the semiconductor memory device may perform the refresh operation without using an auto refresh command.

In an embodiment, a second memory bank group of the memory cell array may independently operate from the first memory bank group.

In an embodiment, when the first memory bank group is activated and the second memory bank group is inactivated, memory banks included in the second memory bank group may automatically perform refresh.

In an embodiment, the semiconductor memory device may have a data input/output (IO) structure with a long bust length.

In an embodiment, the semiconductor memory device may further include an input/output (IO) sense amplifier and an IO circuit. The input/input (IO) sense amplifier is configured to amplify data output from the memory cell array to generate a first data, and transfer input data to the memory cell array. The IO circuit is configured to determine an output order of the first data, perform a parallel-serial conversion to generate an output data, and buffer the input data to provide the buffered data to the IO sense amplifier.

In accordance with another aspect of example embodiments of the inventive concepts, a method of controlling a semiconductor memory device may include performing a data input/output operation on a first memory bank included in a first memory bank group; performing a refresh operation on a second memory bank included in the first memory bank group; performing a refresh operation on the first memory bank included in the first memory bank group; and performing a data input/output operation on the second memory bank included in the first memory bank group.

In an embodiment, the method of controlling a semiconductor memory device may further include performing a refresh operation on memory banks included in a second memory bank group.

In an embodiment, the method may perform the refresh operation without using an auto refresh command.

In an embodiment, the performing the data input/output operation on the first memory bank included in the first memory bank group may perform at the same time as the performing the refresh operation on the second memory bank included in the first memory bank group.

In an embodiment, the performing the refresh operation on the first memory bank included in the first memory bank group may perform at the same time as the performing the data input/output operation on the second memory bank included in the first memory bank group.

According to at least one example embodiment of the inventive concepts, a semiconductor memory device includes an internal address generating circuit configured to analyze an external address and to control timing of the external address to generate an internal address; an internal command generating circuit configured to control timing of an auto refresh operation based on the external address and an external command and to control timing of the external command to generate an internal command; and a memory cell array including one or more memory bank groups, each of the one or more memory bank groups including a plurality of memory banks and operating in response to the internal address and the internal command, wherein, when a read command or a write command is input, if a first portion of the plurality of memory banks of a first memory bank group from among the one or more memory bank groups performs a read operation or a write operation, a second portion of the plurality of memory banks of the first memory bank group performs a refresh operation, the first portion including one or more of the plurality of memory banks of the first memory bank group, the second portion including the one or more of the plurality of memory banks of the first memory bank group which are not included in the first portion.

The internal address may include an address structure in which a row address and a column address are integrated.

The semiconductor memory device may be configured such that, when the read command or write command is input, the one or more memory banks of the first portion of the plurality of memory banks perform an active operation, a read/write operation and a pre-charge operation when a read command or a write command is input.

The semiconductor memory device may be configured to perform the active operation and the pre-charge operation without using an active command and a pre-charge command.

The semiconductor memory device may be configured to perform the refresh operation without using an externally received auto refresh command.

The second memory bank group of the memory cell array may be configured to operate independently from the first memory bank group.

The semiconductor memory device may be configured such that when the first memory bank group is activated and the second memory bank group is inactivated, memory banks included in the second memory bank group perform a refresh operation.

The semiconductor memory device may be configured to have a data input/output (IO) structure with a long burst length.

The semiconductor memory device may further include an input/output (IO) sense amplifier configured to amplify data output from the memory cell array to generate first data, and transfer input data to the memory cell array; and an IO circuit configured to determine an output order of the first data, perform a parallel-serial conversion to generate an output data, and buffer the input data to provide the buffered data to the IO sense amplifier.

According to example embodiments of the inventive concepts, a method of controlling a semiconductor memory device includes performing a data input/output operation on a first memory bank included in a first memory bank group; performing a first refresh operation on a second memory bank included in the first memory bank group; performing a second refresh operation on the first memory bank included in the first memory bank group; and performing a data input/output operation on the second memory bank included in the first memory bank group.

The method may further include performing a third refresh operation on memory banks included in a second memory bank group.

The method may further include controlling a timing of the first refresh operation and a timing of the second refresh operation based on a read command or a write command.

The refresh operation may be performed without using an external auto refresh command.

The data input/output operation performed on the first memory bank included in the first memory bank group may be performed at the same time as the first refresh operation.

The second refresh operation may be performed at the same time as the data input/output operation performed on the second memory bank included in the first memory bank group.

According to example embodiments of the inventive concepts, a semiconductor memory device may include a memory cell array including one or more memory bank groups, each of the one or more memory bank groups including a plurality of memory banks; and an internal command generating circuit configured to receive an external command which does not include a refresh command and configured to control refresh operations of the one or more memory bank groups based on the external command.

The semiconductor device may further include an internal address generating circuit configured to analyze an external address and to control timing of the external address to generate an internal address, wherein the internal command generating circuit is configured to control timing of the refresh operations based on the external address and the external command.

The internal command generating circuit may be configured such that when the external command corresponds to a read command or a write command, based on the external command, the internal command generating circuit controls a first portion of the plurality of memory banks of a first one of the one or more memory bank groups to perform a read operation or a write operation, and the internal command generating circuit controls a second portion of the plurality of memory banks of a first one of the one or more memory bank groups to perform a refresh operation, the first portion including one or more of the plurality of memory banks of the first memory bank group, the second portion including the one or more of the plurality of memory banks of the first memory bank group which are not included in the first portion.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
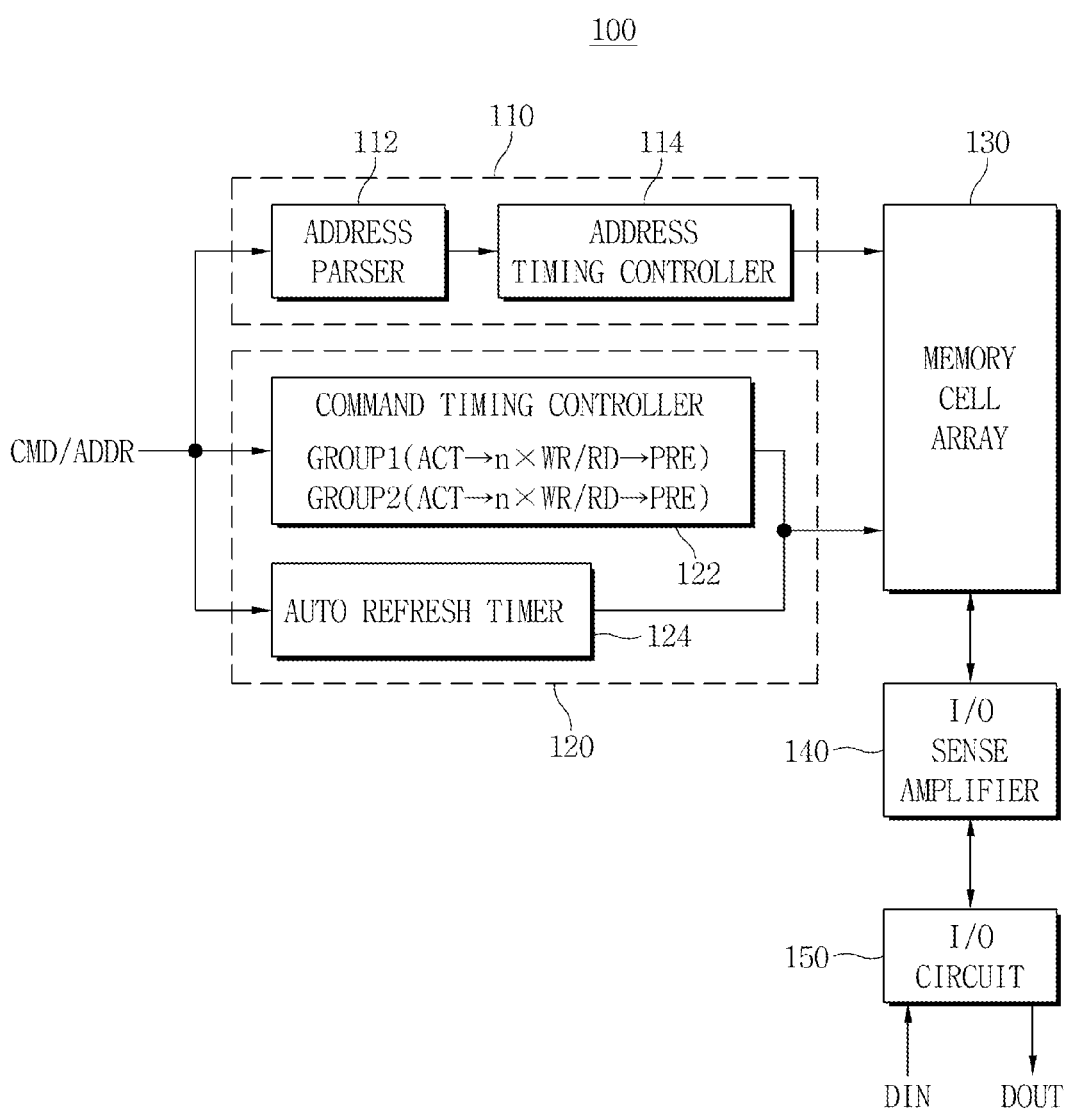
FIG. 1 is a block diagram illustrating a semiconductor memory device in accordance with example embodiments of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys example embodiments of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred example embodiments of the inventive concepts will be described with reference to the accompanying drawings.

FIG. 1 is a circuit diagram illustrating a semiconductor memory device 100 in accordance with example embodiments of the inventive concepts.

Referring to FIG. 1, the semiconductor memory device 100 may include an internal address generating circuit 110, an internal command generating circuit 120, a memory cell array 130, an input/output (I/O) sense amplifier 140 and an input/output (I/O) circuit 150.

The internal address generating circuit 110 parses an external address ADDR and control timing of the external address ADDR to generate an internal address. The internal command generating circuit 120 controls timing of an auto refresh operation based on the external address ADDR and an external command CMD and control timing of the external command CMD to generate the internal command. The memory cell array 130 includes at least one memory bank group, each of the one or more memory bank groups includes a plurality of memory banks and operates in response to the internal address and the internal command.

The internal address generating circuit 110 may include an address parser 112 that parses the external address ADDR and an address timing controller 114 that controls timing of the external address ADDR to generate the internal address. The internal command generating circuit 120 may include a command timing controller 122 that controls timing of the external command CMD and an auto refresh timer 124 that controls an auto refresh timing based on the external address ADDR and the external command CMD.

The internal command generating circuit 120 may control the timing of the command so that a first memory bank group GROUP1 and a second memory bank group GROUP2 in the memory cell array 130 operate independently. For example, when the first memory bank group GROUP1 performs a read operation, if only a read command RD is input, the semiconductor memory device 100 may perform active operation ACT, perform n times a burst read operation on the first memory bank group GROUP1, and perform in a pre-charge operation. The active operation ACT may, for example, activate one or more memory banks preparing them for at least one of data read and write operations. Similarly, when the first memory bank group GROUP1 performs a write operation, if only a write command WR is input, the semiconductor memory device 100 may perform active operation ACT, perform n times a burst write operation on the first memory bank group GROUP1, and perform a pre-charge operation.

In case a read command or a write command is input, when a part of memory banks of a first memory bank group GROUP1 perform a read operation or a write operation, the rest of the memory banks of the first memory bank group GROUP1 may perform a refresh operation, for example in response to signals received from the auto refresh timer 124, without the need to receive an exterior auto refresh command from outside memory device 100.

Further, when the first memory bank group GROUP1 is activated and the second memory bank group GROUP2 is inactivated, memory banks included in the second memory bank group GROUP2 may automatically perform refresh, for example in response to signals received from the auto refresh timer 124. Further, while the first memory bank group GROUP1 performs a read operation, the second memory bank group GROUP2 may perform a read operation or a refresh operation.

The I/O sense amplifier 140 amplifies data output from the memory cell array 130 to generate a first data, and transfers an input data DIN to the memory cell array 130. The I/O circuit 150 determines an output order of the first data, perform a parallel-serial conversion to generate an output data DOUT, and buffer the input data DIN to provide the buffered data to the IO sense amplifier 140.

The semiconductor memory device of FIG. 1 may be a data memory for storing only data except for a program.

Figure 2:
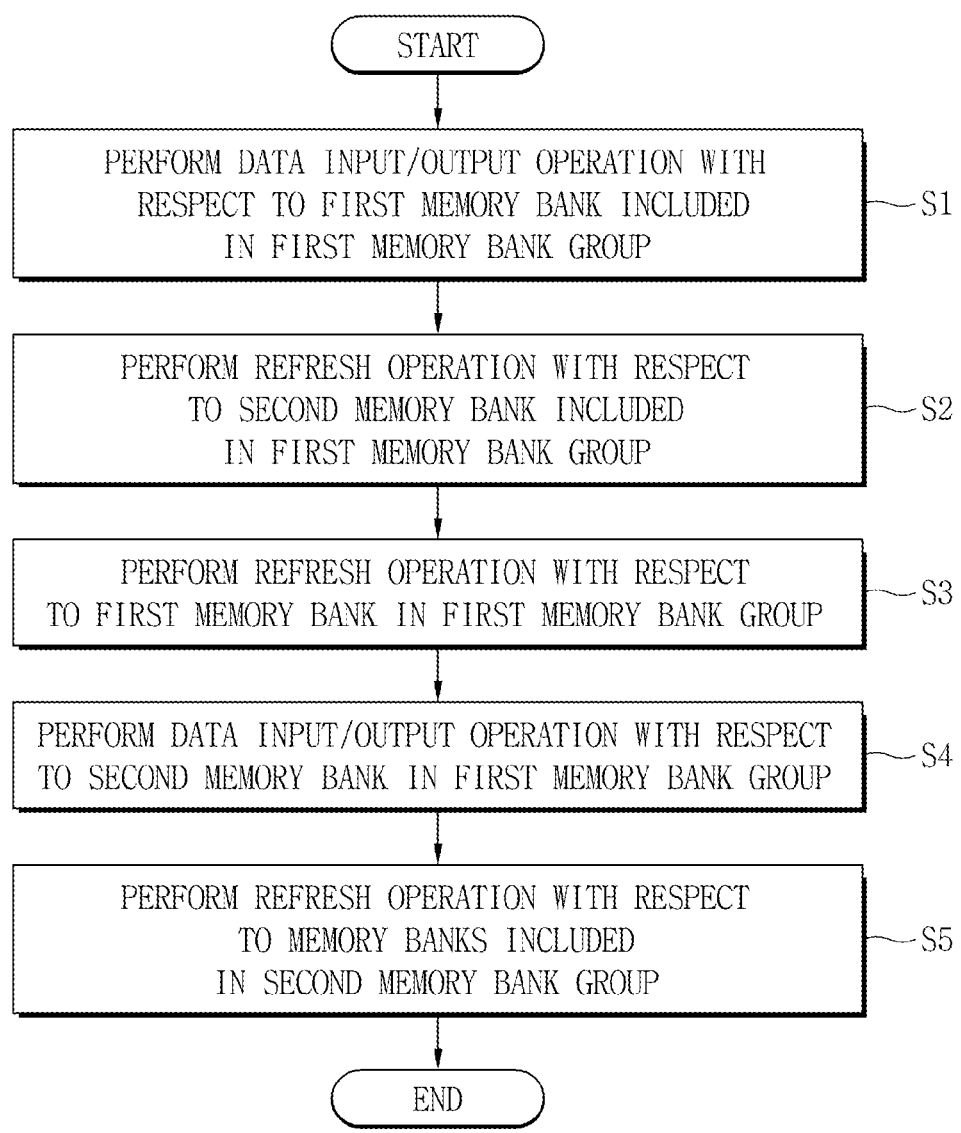
FIG. 2 is a flowchart illustrating a method of controlling the semiconductor memory device in accordance with example embodiments of the inventive concepts.

FIG. 2 is a flowchart illustrating a method of controlling the semiconductor memory device in accordance with example embodiments of the inventive concepts.

Referring to FIG. 2, the method of controlling a semiconductor memory device in accordance with example embodiments of the inventive concepts may include the following operations.

1) performing a data input/output operation on a first memory bank included in a first memory bank group (S1).

2) performing a refresh operation on a second memory bank included in the first memory bank group (S2).

3) performing a refresh operation on the first memory bank included in the first memory bank group (S3).

4) performing a data input/output operation on the second memory bank included in the first memory bank group (S4).

5) performing a refresh operation on memory banks included in a second memory bank group (S5).

In FIG. 2, operations S1 and S2 may be executed at the same time, and operations S3 and S4 may be executed at the same time. For example, while an input/output operation on the first memory bank included in the first memory bank group is performed, a refresh operation on the second memory bank included in the first memory bank group may be performed. Further, while a refresh operation on the first memory bank included in the first memory bank group is performed, a data input/output operation on the second memory bank included in the first memory bank group may be performed.

As illustrated in FIG. 2, the second memory bank group may independently operate from the first memory bank group, and the second memory bank group may perform refresh operation when the second memory bank group is not activated. Further, when the second memory bank group is activated, the second memory bank group may perform a data input/output operation.

Figure 3:
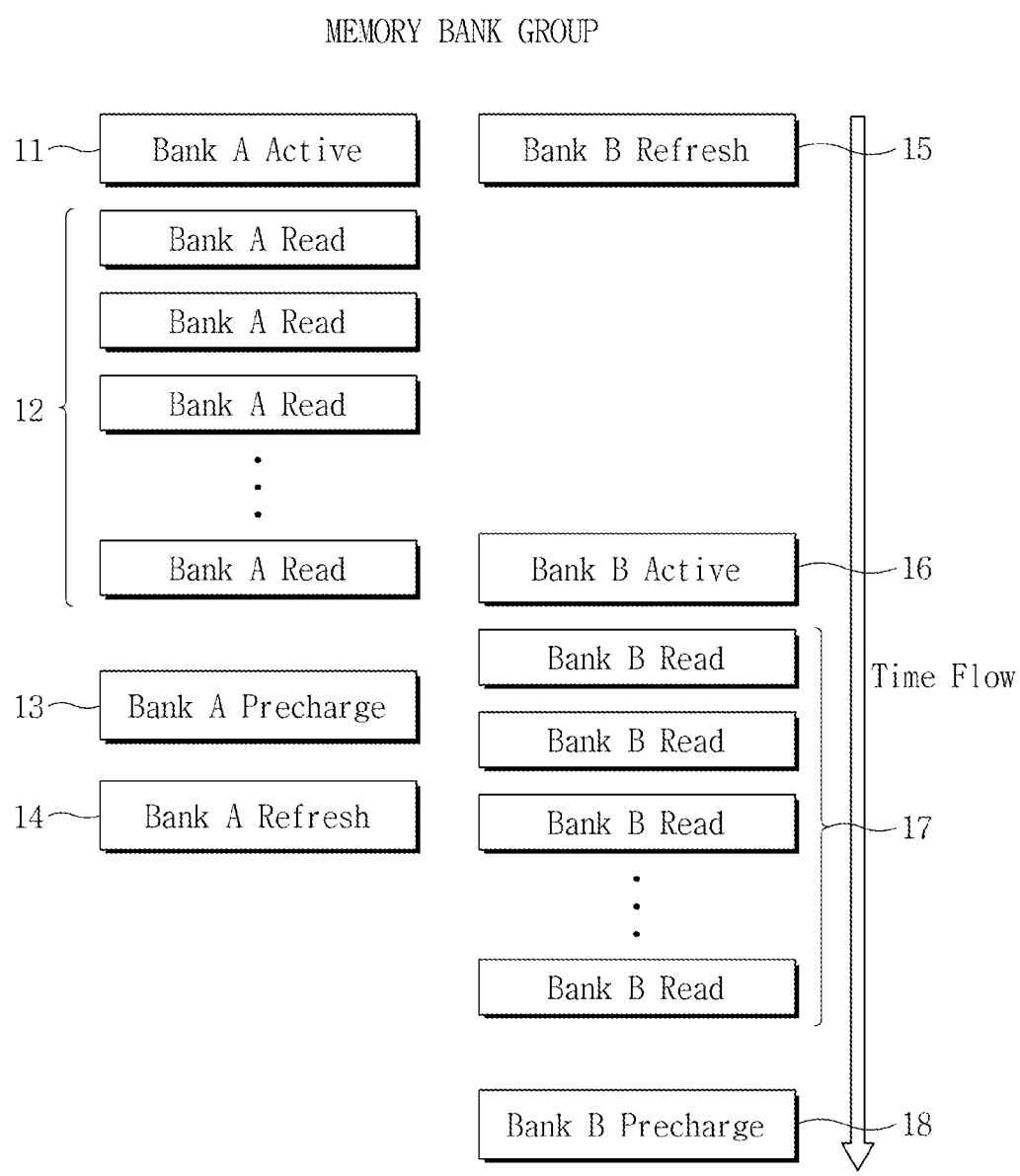
FIG. 3 is a diagram illustrating an operation of the semiconductor memory device performing a burst read operation in accordance with example embodiments of the inventive concepts.

FIG. 3 is a diagram illustrating an operation of the semiconductor memory device performing a burst read operation in accordance with example embodiments of the inventive concepts. The burst read operation is an operation mode in which two or more data are read or written at one time when one read command or one write command is input.

In FIG. 3, while a first memory bank BANK A included in a memory bank group performs an active operation 11, a second memory bank BANK B included in the memory bank group may perform a refresh operation. When a read command is input, the first memory bank BANK A may automatically perform the active operation 11, a read operation 12, a pre-charge operation 13 and the refresh operation 14, for example in response to signals received from the internal command generating circuit 120. During the read operation 12, data stored in the first memory bank BANK A are read according to a burst length of the semiconductor memory device. Similarly, when the read command is input, the second memory bank BANK B may also automatically perform the active operation 16, a read operation 17, a pre-charge operation 18 and the refresh operation 15, for example in response to signals received from internal command generating circuit.

Accordingly, the semiconductor memory device according to embodiment of the example embodiments of the inventive concepts may perform a refresh operation even without receiving a refresh command from the exterior.

Figure 4:
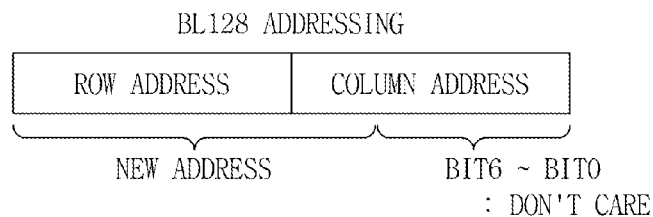
FIG. 4 is a diagram illustrating a method of generating an address of the semiconductor memory device in accordance with example embodiments of the inventive concepts.

FIG. 4 is a diagram illustrating a method of generating an address, for example an internal address, of the semiconductor memory device in accordance with example embodiments of the inventive concepts. FIG. 4 illustrates the method of generating an address of the semiconductor memory device when the burst length BL is 128. The address illustrated in FIG. 4 includes two portions: New Address and don't care bits. The New Address portion has an integrated structure of a row address ROW ADDRESS and part of a column address COLUMN ADDRESS, and lower seven bits BIT6:BIT0 of the column address are set to a don't care condition because the burst length is 128. The New Address may be, for example, an internal address.

Figure 5:
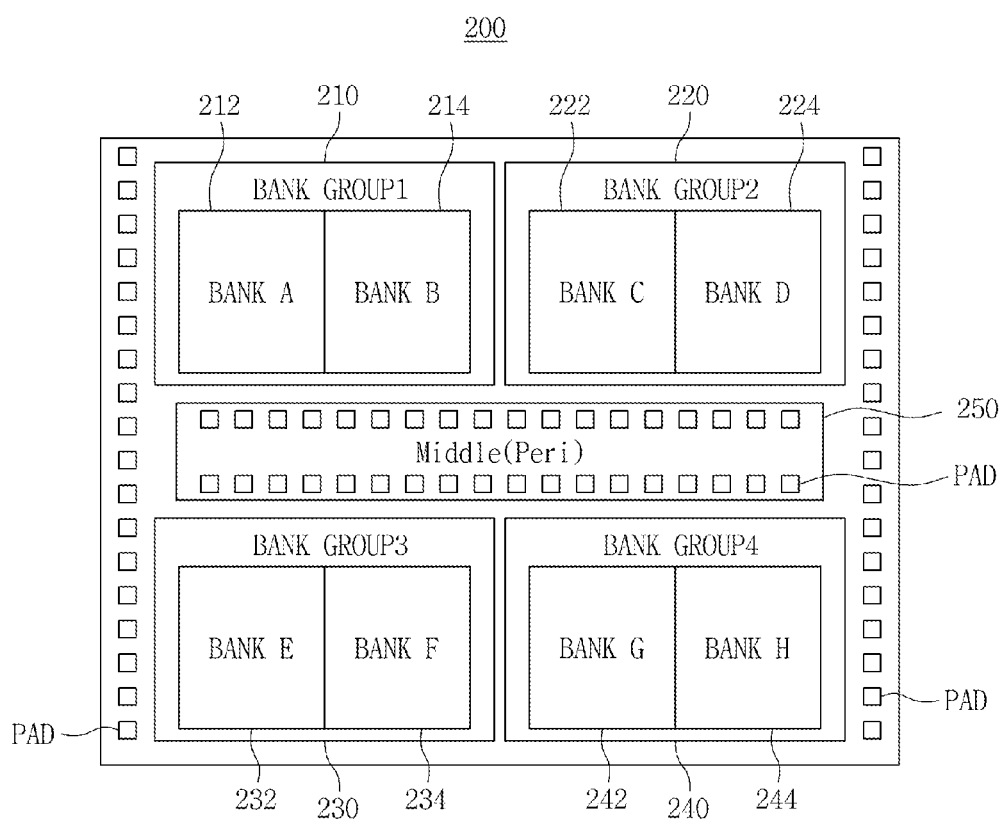
FIG. 5 is a plan view illustrating an example of a layout structure of the semiconductor memory device of FIG. 1 in accordance with example embodiments of the inventive concepts.

FIG. 5 is a plan view illustrating an example of a layout structure of the semiconductor memory device of FIG. 1 in accordance with example embodiments of the inventive concepts.

Referring to FIG. 5, a semiconductor memory device 200 may include four memory bank groups BANK GROUP1 to BANK GROUP4. Each of the memory bank groups BANK GROUP1 to BANK GROUP4 may include two memory banks. The memory bank group BANK GROUP1 includes memory banks BANK A and BANK B, the memory bank group BANK GROUP2 includes memory banks BANK C and BANK D, the memory bank group BANK GROUP3 includes memory banks BANK E and BANK F, and the memory bank group BANK GROUP4 includes memory banks BANK G and BANK H. Further, pads PAD for communicating with the exterior are disposed at the edge and a peripheral region 250 of the middle portion of the semiconductor memory device 200.

As described above, when the memory bank BANK A included in the memory bank group BANK GROUP1 performs a data input/output operation in a read mode or a write mode, the memory bank BANK B may perform a refresh operation. Similarly, when the memory bank BANK C included in the memory bank group BANK GROUP2 performs the data input/output operation in the read mode or the write mode, the memory bank BANK D may perform the refresh operation, when the memory bank BANK E included in the memory bank group BANK GROUP3 performs the data input/output operation in the read mode or the write mode, the memory bank BANK F may perform the refresh operation, and when the memory bank BANK G included in the memory bank group BANK GROUP4 performs the data input/output operation in the read mode or the write mode, the memory bank BANK H may perform the refresh operation.

Although not shown in the drawings, the number of memory bank groups of the semiconductor memory device may not only be 4 but also 8 or more, and each memory bank group may include 2 or more memory banks.

Figure 6:
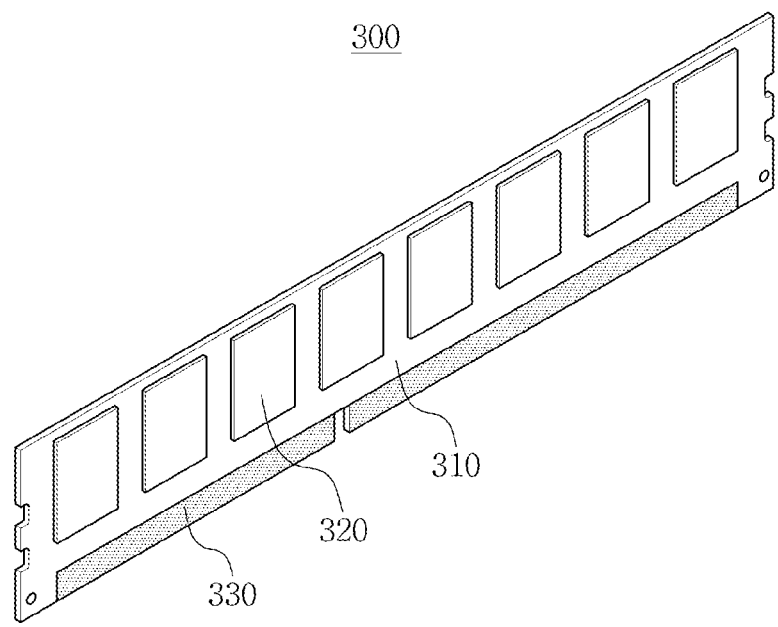
FIGS. 6 to 8 are diagrams illustrating memory modules including the semiconductor memory device in accordance with example embodiments of the inventive concepts.
Figure 7:
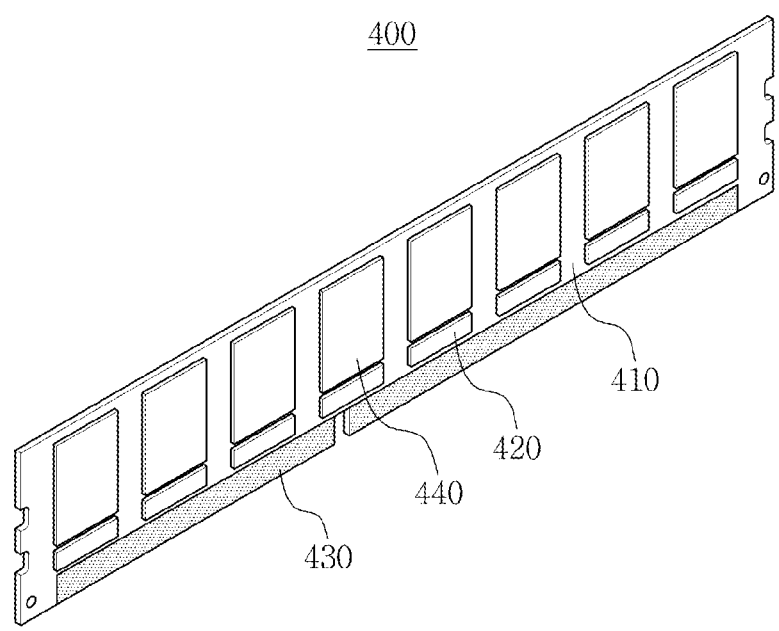
Figure 8:
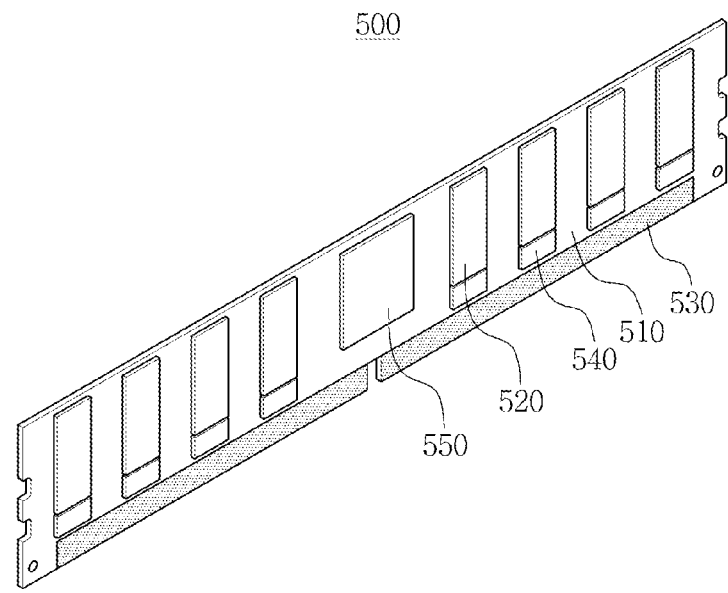

FIGS. 6 to 8 are diagrams illustrating memory modules including semiconductor memory devices in accordance with example embodiments of the inventive concepts. Referring to FIG. 6, the memory module 300 may include a printed circuit board (PCB) 310, a plurality of memory chips 320, and a connector 330. The plurality of memory chips 320 may be bonded to top and bottom surfaces of the PCB 310. The connector 330 may be electrically connected to the plurality of memory chips 320 through conductive lines (not shown). Also, the connector 330 may be connected to a slot of an external host.

Referring to FIG. 7, the memory module 400 may include a PCB 410, a plurality of memory chips 440, a connector 430, and a plurality of buffers 420. Each of the plurality of buffers 420 may be disposed between the memory chips 420 and the connector 430.

The memory chips 440 and the buffers 420 may be provided on top and bottom surfaces of the PCB 410. The memory chips 440 and the buffers 420 formed on the top and bottom surfaces of the PCB 410 may be connected through a plurality of via holes.

Referring to FIG. 8, the memory module 500 may include a PCB 510, a plurality of memory chips 520, a connector 530, a plurality of buffers 540, and a controller 550.

The memory chips 520 and the buffers 540 may be provided on top and bottom surfaces of the PCB 510. The memory chips 520 and the buffers 540 formed on the top and bottom surfaces of the PCB 510 may be connected through a plurality of via holes.

In FIGS. 6 to 8, the memory chips may include the semiconductor memory devices in accordance with example embodiments of the inventive concepts. Therefore, the memory chips may perform a refresh operation without an exterior auto refresh command, for example in the manner discussed above with reference to FIGS. 1-5.

Figure 9:
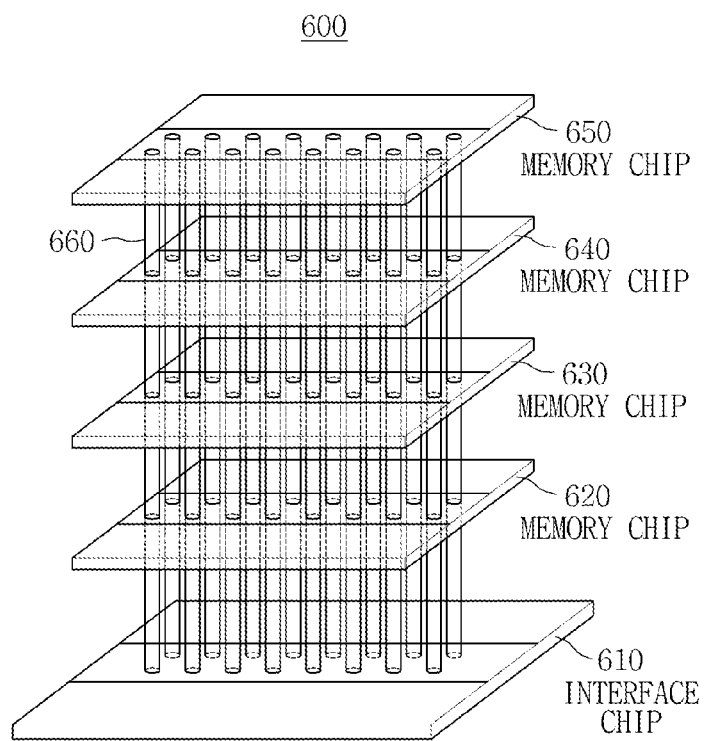
FIG. 9 is a schematic perspective view illustrating an example of a stacked semiconductor device including the semiconductor memory device in accordance with example embodiments of the inventive concepts.

FIG. 9 is a schematic perspective diagram illustrating an example of a stacked semiconductor device 600 including a semiconductor memory device in accordance with example embodiments of the inventive concepts.

Referring to FIG. 9, the stacked semiconductor device 600 may include an interface chip 610, and memory chips 620, 630, 640 and 650 which are electrically connected through through-silicon vias 660. Although the through-silicon vias 660 disposed in two rows are shown in FIG. 9, the stacked semiconductor device 600 may include any number of through-silicon vias.

The memory chips 620, 630, 640 and 650 included in the stacked semiconductor device 600 may include the semiconductor memory device in accordance with the Example embodiments of the inventive concepts. Therefore, the memory chips 620, 630, 640 and 650 may perform a refresh operation without the exterior auto refresh command, for example in the manner discussed above with reference to FIGS. 1-5.

The interface chip 610 may perform interfacing between the memory chips 620, 630, 640 and 650 and the external devices.

FIGS. 10 to 13 are block diagrams illustrating examples of memory systems including a semiconductor memory device in accordance with example embodiments of the inventive concepts.

Figure 10:
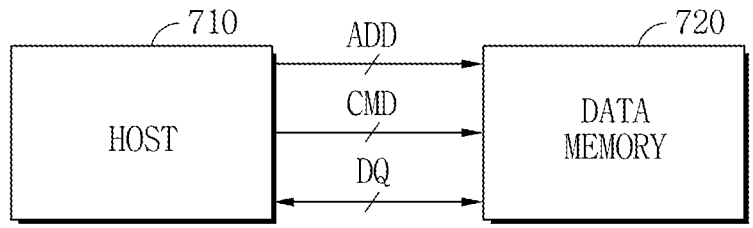
FIGS. 10 to 13 are block diagrams illustrating memory systems including the semiconductor memory device in accordance with Example embodiments of the inventive concepts.

Referring to FIG. 10, the memory system 700 may include a host 710 and a data memory device 720.

The host 710 may generate an address signal ADD and a command CMD, and provide the address signal ADD and the command CMD to the data memory device 720 through buses. Data DQ may be transmitted from the host 710 to the data memory device 720 through the buses, or transmitted from the data memory device 720 to the host 710 through the buses.

The data memory device 720 may include semiconductor memory devices in accordance with example embodiments of the inventive concepts. Therefore, the data memory device 720 may perform a refresh operation without the exterior auto refresh command, for example in the manner discussed above with reference to FIGS. 1-5.

Figure 11:
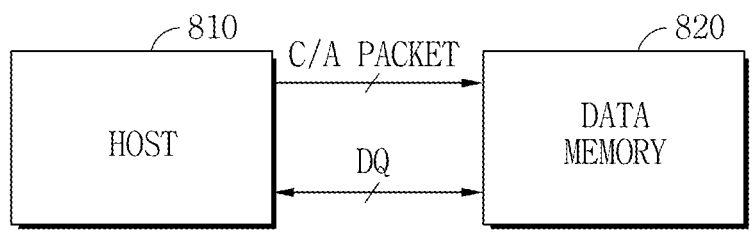

Referring to FIG. 11, the memory system 800 may include a host 810 and a data memory device 820. In the memory system 800 of FIG. 11, the command CMD and an address ADD are integrated to form a packetized signal C/A, differently from the memory system 700 of FIG. 10.

Figure 12:
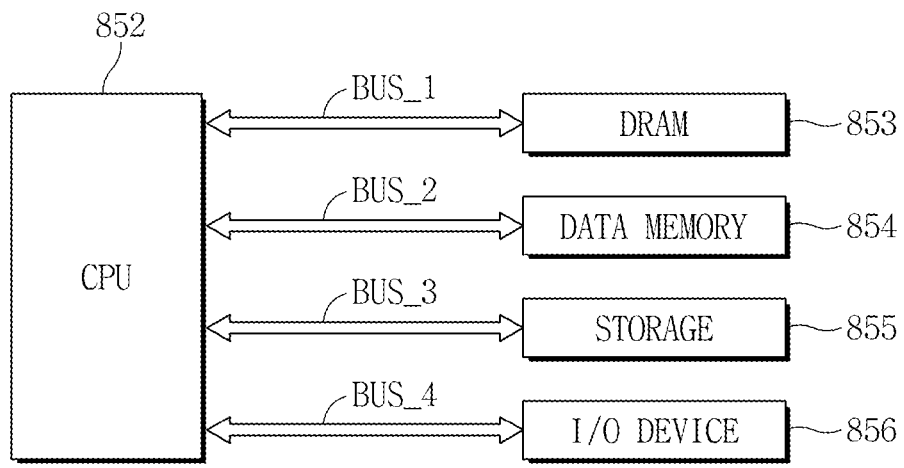

Referring to FIG. 12, the memory system 850 may include a central processing unit (CPU) 852, a DRAM 853, a data memory device 854, an external storage device 855 and an I/O device 856.

The DRAM 853 may communicate with the CPU 852 through a first bus BUS_1, the data memory device 854 may communicate with the CPU 852 through a second bus BUS_2, the external storage device 855 may communicate with the CPU 852 through a third bus BUS_3, and the I/O device 856 may communicate with the CPU 852 through a fourth bus BUS_4. The data memory device 854 is mainly used to store data, and may include semiconductor memory devices according to example embodiments of the inventive concepts. Therefore, the data memory device 854 may perform a refresh operation without the exterior auto refresh command, for example in the manner discussed above with reference to FIGS. 1-5. The data memory device 854 may include a DRAM, and have a long burst length BL and perform a burst operation.

Figure 13:
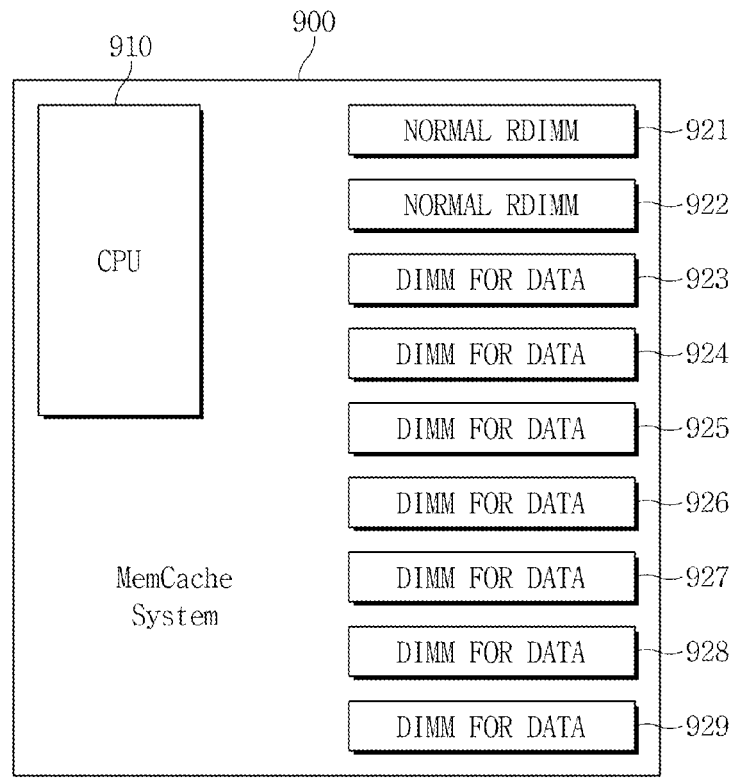

Referring to FIG. 13, the memory system 900 may be a MemCache system that includes a CPU 910, a DRAM 853, a normal registered dual-in-line memory modules (RDIMM) 921 and 922, a dual-in-line memory modules (DIMM) 923 to 929.

In FIG. 13, the normal RDIMM 921 and 922 may be used to store a program and data, and the DIMM 923 to 929 may be used to store data. Each of the DIMM 923 to 929 may include semiconductor memory devices according to example embodiments of the inventive concepts. Therefore, the semiconductor memory devices included in the DIMM 923 to 929 may perform a refresh operation without the exterior auto refresh command, for example in the manner discussed above with reference to FIGS. 1-5. The semiconductor memory devices included in the DIMM 923 to 929 may include a DRAM, and have a long burst length BL and perform a burst operation.

Figure 14:
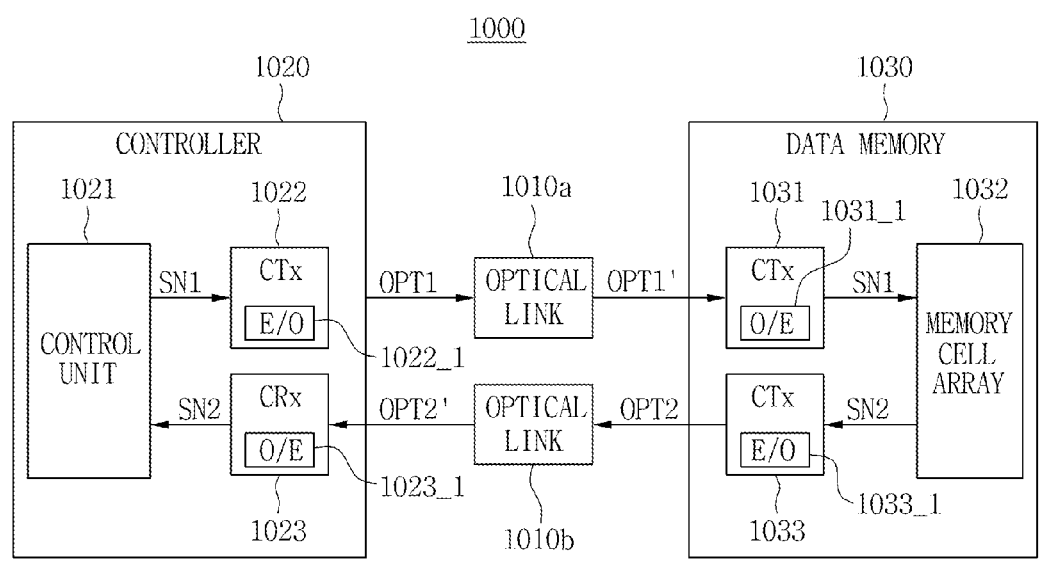
FIG. 14 is a block diagram illustrating an example of a memory system including the semiconductor memory device and an optical link in accordance with example embodiments of the inventive concepts.

FIG. 14 is a block diagram illustrating an example of a memory system 1000 including a semiconductor memory device and an optical link according to example embodiments of the inventive concepts.

Referring to FIG. 14, the memory system 1000 may include a controller 1020, a data memory device 1030, and a plurality of optical links 1010*a* and 1010*b* configured to interconnect the controller 1020 and the data memory device 1030. The controller 1020 may include a control unit 1021, a first transmitter 1022, and a first receiver 1023. The control unit 1021 may transmit a control signal SN1 to the first transmitter 1022.

The first transmitter 1022 may include a first optical modulator 1022_1, which may convert the control signal SN1, which is an electric signal, into a first optical transmission signal OPT1, and transmit the first optical transmission signal OPT1 to the optical link 1010*a*.

The first receiver 1023 may include a first optical demodulator 1023_1, which may convert a second optical receiving signal OPT2' received from the optical link 1010*b* into a data signal SN2, which is an electric signal, and transmit the data signal SN2 to the control unit 1021.

The data memory device 1030 may include a second receiver 1031, a memory cell array 1032, and a second transmitter 1033. The second receiver 1031 may include a second optical modulator 1031_1, which may convert a first optical receiving signal OPT1' received from the optical link 1010*a* into the control signal SN1, which is the electric signal, and transmit the control signal SN1 to the memory cell array 1032.

In the memory cell array 1032, data may be written under the control of the control signal SN1, or the data signal SN2 output from the memory cell array 1032 may be transmitted to the second transmitter 1033.

The second transmitter 1033 may include a second optical modulator 1033_1, which may convert the data signal SN2, which is the electric signal, into a second optical data signal OPT2, and transmit the second optical data signal OPT2 to the optical link 1010*b*.

The data memory device 1030 may include the semiconductor memory device according to example embodiments of the inventive concepts. Therefore, the data memory device 1030 may perform a refresh operation without the exterior auto refresh command, for example in the manner discussed above with reference to FIGS. 1-5. Further, the data memory device 1030 may include a DRAM, and have a long burst length BL and perform a burst operation.

Figure 15:
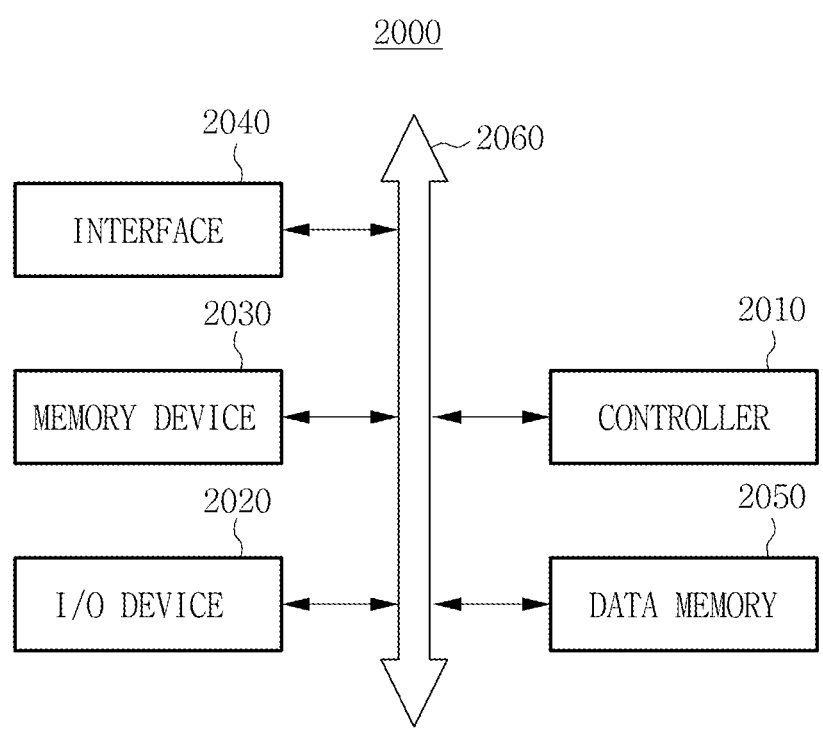
FIG. 15 is a block diagram illustrating an example of an electronic system including the semiconductor memory device in accordance with example embodiments of the inventive concepts.

FIG. 15 is a block diagram illustrating an example of an electronic system 2000 including a semiconductor memory device in accordance with example embodiments of the inventive concepts.

Referring to FIG. 15, the electronic system 2000 in accordance with example embodiments of the inventive concepts may include a controller 2010, an input and output device 2020, a memory device 2030, an interface 2040, a data memory device 2050 and a bus 2060. The memory device 2030 may be generally a semiconductor memory device for storing a program and data. The data memory device 2050 may include the semiconductor memory device in accordance with example embodiments of the inventive concepts. Therefore, the data memory device 2050 may perform a refresh operation without the exterior auto refresh command, for example in the manner discussed above with reference to FIGS. 1-5. Further, the data memory device 2050 may include a DRAM, and have a long burst length and perform a burst operation. The bus 2060 may function to provide a path in that data is mutually transferred among the controller 2010, the input and output device 2020, the memory device 2030, the data memory device 2050 and the interface 2040.

The controller 2010 may include any one of logic devices that can perform functions of at least one of a microprocessor, a digital signal processer, and a microcontroller, or functions similar to those. The input and output device 2020 may include at least one selected from a key pad, a key board, and a display device. The memory device 2030 may function to store data and/or instructions performed by the controller 2010.

The memory device 2030 may include a volatile memory chip such as a dynamic random access memory (DRAM) and a static random access memory (SRAM), a non-volatile memory chip such as a flash memory, a phase change memory, a magnetic random access memory (MRAM), or a resistive random access memory (RRAM), or a combination of thereof.

The interface 2040 may function to transmit/receive data to/from a communication network. The interface 2040 can include an antenna, wired or wireless transceivers or the like to transmit and receive data by wires or wirelessly. In addition, the interface 2040 may include optical fibers to transmit and receive data through the optical fibers. The electronic system 2000 may be further provided with an application chipset, a camera image processor, and an input/output (I/O) device.

The electronic system 2000 may be implemented as a mobile system, personal computer, an industrial computer, or a logic system that may perform various functions. For example, the mobile system may be any one of a personal digital assistant (PDA), a portable computer, a web tablet, a mobile phone, a wireless phone, a laptop computer, a memory card, a digital music system, and an information transmitting/receiving system. If the electronic system 2000 is an apparatus that can perform wireless communication, the electronic system 2000 may be used in a communication system such as a Code Division multiple Access (CDMA), a Global System for Mobile communication (GSM), a North American Digital Cellular (NADC), an Enhanced-Time Division Multiple Access (E-TDMA), a Wideband Code Division Multiple Access (WCDMA), or a CDMA 2000.

In the semiconductor memory device according to example embodiments of the inventive concepts, when a read command or a write command is input, in case that a first memory bank included in a memory bank group of a memory cell array perform an input/output operation, a second memory bank of the memory bank group may perform a refresh operation. On the contrary, when the first memory bank of the memory bank group perform a refresh operation, a second memory bank of the memory bank group may perform an input/output operation. Therefore, the semiconductor memory device according to example embodiments of the inventive concepts may perform refresh operation without the exterior auto refresh command. Therefore, the semiconductor memory device according to example embodiments of the inventive concepts may perform refresh without using an exterior auto refresh command. Thus, in the semiconductor memory device according to example embodiments of the inventive concepts, addressing is easy, a whole data bandwidth can be used, and latency may not vary. Accordingly, the semiconductor memory device according to example embodiments of the inventive concepts may be suitable for a system having a data input/output structure of long burst length, and also suitable for storing data.

Example embodiments of the inventive concepts may be applied to a semiconductor device and, particularly to a DRAM and a memory system including the DRAM.

The foregoing is illustrative of embodiments and is not to be construed as limiting thereof. Example embodiments of the inventive concepts having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims. In the claims, means-plus-function clauses are intended to cover the structures described herein as performing the recited function, and not only structural equivalents but also equivalent structures.

What is claimed is:

1. A semiconductor memory device, comprising:
    an internal address generating circuit configured to analyze an external address and to control timing of the external address to generate an internal address;
    an internal command generating circuit configured to control timing of an auto refresh operation based on the external address and an external command and to control timing of the external command to generate an internal command; and
    a memory cell array including one or more memory bank groups, each of the one or more memory bank groups including a plurality of memory banks and operating in response to the internal address and the internal command,
    wherein, when a read command or a write command is input, if a first portion of the plurality of memory banks of a first memory bank group from among the one or more memory bank groups performs a read operation or a write operation, a second portion of the plurality of memory banks of the first memory bank group performs a refresh operation, the first portion including one or more of the plurality of memory banks of the first memory bank group, the second portion including the one or more of the plurality of memory banks of the first memory bank group which are not included in the first portion.

2. The device according to claim 1, wherein the internal address includes an address structure in which a row address and a column address are integrated.

3. The device according to claim 1, wherein the semiconductor memory device is configured such that, when the read command or write command is input, the one or more memory banks of the first portion of the plurality of memory banks perform an active operation, a read/write operation and a pre-charge operation when a read command or a write command is input.

4. The device according to claim 3, wherein the semiconductor memory device is configured to perform the active operation and the pre-charge operation without using an active command and a pre-charge command.

5. The device according to claim 1, wherein the semiconductor memory device is configured to perform the refresh operation without using an externally received auto refresh command.

6. The device according to claim 1, wherein a second memory bank group of the memory cell array is configured to operate independently from the first memory bank group.

7. The device according to claim 6, wherein, the semiconductor memory device is configured such that when the first memory bank group is activated and the second memory bank group is inactivated, memory banks included in the second memory bank group perform a refresh operation.

8. The device according to claim 1, wherein the semiconductor memory device is configured to have a data input/output (IO) structure with a long burst length.

9. The memory device of claim 1, wherein,
    the memory cell array includes a group of memory banks, the group of memory banks including first set of one or more memory banks and a second set of one or more memory banks, and
    the internal command generating circuit is configured such that, when a request for memory access operation is received, the internal command generating circuit controls the first and second sets of one or more memory banks such that,
        during a first period of time, the first set of one or more memory banks performs a refresh operation while the second set of one or memory banks performs the memory access operation, and
        during a second period of time, the second set of one or more memory banks performs a refresh operation while the first set of one or memory banks performs the memory access operation,
    the memory access operation being one of a read operation and a write operation,
    the first set of one or more memory banks being one or more memory banks that are not included in the second set of one or more memory banks and do not perform the memory access operation during the first period of time,
    the second period of time being after the first period of time.

10. The device according to claim 1, further comprising:
    an input/output (IO) sense amplifier configured to amplify data output from the memory cell array to generate first data, and to transfer input data to the memory cell array; and
    an IO circuit configured to determine an output order of the first data, perform a parallel-serial conversion to generate an output data, and to buffer the input data to provide the buffered data to the IO sense amplifier.

11. A method of controlling a semiconductor memory device, comprising:
    performing a data input/output operation on a first memory bank included in a first memory bank group;
    performing a first refresh operation on a second memory bank included in the first memory bank group;
    performing a second refresh operation on the first memory bank included in the first memory bank group; and
    performing a data input/output operation on the second memory bank included in the first memory bank group;
    wherein the data input/output operation performed on the first memory bank included in the first memory bank group is performed at a same time as the first refresh operation.

12. The method according to claim 11, further comprising:
    performing a third refresh operation on memory banks included in a second memory bank group.

13. The method according to claim 11, further comprising:
    controlling a timing of the first refresh operation and a timing of the second refresh operation based on a read command or a write command.

14. The method according to claim 11, wherein the refresh operation is performed without using an external auto refresh command.

15. The method according to claim 11, wherein the second refresh operation is performed at the same time as the data input/output operation performed on the second memory bank included in the first memory bank group.

16. The method according to claim 11, wherein,
the data input/output operation performed on the second memory bank included in the first memory bank group is performed at the same time as the second refresh operation,
the data input/output operation performed on the first memory bank and the first refresh operation take place during a first time period,
the data input/output operation performed on the second memory bank and the second refresh operation take place during a second time period,
no data input/output operation is performed on the first memory bank during the second time period, and
no data input/output operation is performed on the second memory bank during the first time period.

17. A semiconductor memory device comprising:
a memory cell array including one or more memory bank groups, each of the one or more memory bank groups including a plurality of memory banks; and
an internal command generating circuit configured to receive an external command which does not include a refresh command and configured to control refresh operations of the one or more memory bank groups based on the external command,
wherein the internal command generating circuit is configured such that when the external command corresponds to a read command or a write command, based on the external command,
the internal command generating circuit controls a first portion of the plurality of memory banks of a first one of the one or more memory bank groups to perform a read operation or a write operation, and
the internal command generating circuit controls a second portion of the plurality of memory banks of a first one of the one or more memory bank groups to perform a refresh operation, the first portion including one or more of the plurality of memory banks of the first memory bank group, the second portion including the one or more of the plurality of memory banks of the first memory bank group which are not included in the first portion.

18. The semiconductor device of claim 17, further comprising:
an internal address generating circuit configured to analyze an external address and to control timing of the external address to generate an internal address,
wherein the internal command generating circuit is configured to control timing of the refresh operations based on the external address and the external command.

19. The semiconductor device of claim 17, wherein,
the memory cell array includes a group of memory banks, the group of memory banks including first set of one or more memory banks and a second set of one or more memory banks, and
the internal command generating circuit is configured such that, when a request for memory access operation is received, the internal command generating circuit controls the first and second sets of one or more memory banks such that,
during a first period of time, the first set of one or more memory banks performs a refresh operation while the second set of one or memory banks performs the memory access operation, and
during a second period of time, the second set of one or more memory banks performs a refresh operation while the first set of one or memory banks performs the memory access operation,
the memory access operation being one of a read operation and a write operation,
the first set of one or more memory banks being one or more memory banks that are not included in the second set of one or more memory banks and do not perform the memory access operation during the first period of time,
the second period of time being after the first period of time.

* * * * *